United States Patent
Lee

(10) Patent No.: US 8,890,627 B2
(45) Date of Patent: Nov. 18, 2014

(54) VOLTAGE CONTROLLED OSCILLATOR

(71) Applicant: Via Technologies, Inc., New Taipei (TW)

(72) Inventor: Yeong-Sheng Lee, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 3 days.

(21) Appl. No.: 13/943,174

(22) Filed: Jul. 16, 2013

(65) Prior Publication Data

US 2013/0300511 A1    Nov. 14, 2013

Related U.S. Application Data

(63) Continuation-in-part of application No. 13/288,608, filed on Nov. 3, 2011, now Pat. No. 8,519,799.

(30) Foreign Application Priority Data

Dec. 24, 2010  (TW) ................ 99145760 A

(51) Int. Cl.
*H03K 3/03*     (2006.01)
*H03B 1/00*     (2006.01)

(52) U.S. Cl.
CPC .............. *H03B 1/00* (2013.01); *H03K 3/0322* (2013.01)

USPC ............................................ 331/57; 331/185

(58) Field of Classification Search
USPC ...................................... 331/57, 185
See application file for complete search history.

(56) References Cited

U.S. PATENT DOCUMENTS

| | | | |
|---|---|---|---|
| 5,559,473 | A  | 9/1996  | Anderson et al. |
| 7,138,845 | B2 | 11/2006 | Lin |
| 7,193,443 | B1 | 3/2007  | Smith et al. |
| 7,592,877 | B2 | 9/2009  | Shiramizu et al. |
| 8,081,038 | B2 | 12/2011 | Lee et al. |

*Primary Examiner* — Joseph Chang
(74) *Attorney, Agent, or Firm* — McClure, Qualey & Rodack, LLP

(57) ABSTRACT

A voltage controlled oscillator generating an oscillation signal according to a first control signal without a silent region. The voltage controlled oscillator includes a control signal adjuster and a plurality of delay cells. The control signal adjuster receives the first control signal and generates a second and a third control signal according to the first control signal. The voltage level of the third control signal is higher than that of the second control signal and the voltage level of the second control signal is higher than that of the first control signal. The plurality of delay cells are ring-connected and controlled by the first, the second, and the third control signals to generate the oscillation signal. Each delay cell includes three sets of current generation transistors. The three sets of current generation transistors are separately controlled by the three different control signals.

13 Claims, 8 Drawing Sheets

US 8,890,627 B2

VOLTAGE CONTROLLED OSCILLATOR

CROSS REFERENCE TO RELATED APPLICATIONS

This application is a Continuation-In-Part of pending U.S. patent application Ser. No. 13/288,608, filed Nov. 3, 2011 and entitled "Voltage Controlled Oscillator," which claims priority of Taiwan Patent Application No. 99145760, the entirety of which are incorporated by reference herein.

BACKGROUND OF THE INVENTION

1. Field of the Invention

The present invention relates to voltage controlled oscillators.

2. Description of the Related Art

A voltage controlled oscillator (VCO) is generally controlled by a voltage input to modify the oscillation frequency of a generated oscillation signal.

In conventional VCO circuits, the voltage input has to be great enough to trigger oscillation. FIG. 1 shows a relationship between a voltage input VCNT and an oscillation frequency fout of a conventional VCO circuit. As shown, when the voltage input VCNT is within a silent region 102, the VCO is silent and the oscillation frequency fout is zero.

BRIEF SUMMARY OF THE INVENTION

A voltage controlled oscillator in accordance with an exemplary embodiment of the invention generates an oscillation signal according to a first control signal. The disclosed voltage controlled oscillator comprises a control signal adjuster and a plurality of delay cells. The control signal adjuster receives the first control signal and generates a second control signal and a third control signal according to the first control signal. The second control signal is generated to be higher than a voltage level of the first control signal and the third control signal is generated to be higher than a voltage level of the second control signal. The plurality of delay cells are ring-connected and controlled by the first, the second, and the third control signals to generate the oscillation signal. Each delay cell comprises three sets of current generation transistors. In the first set of current generation transistors, each transistor provides a control terminal to receive the first control signal. In the second set of current generation transistors, each transistor provides a control terminal to receive the second control signal. In the third set of current generation transistors, each transistor provides a control terminal to receive the third control signal.

In accordance with another exemplary embodiment of the invention, a voltage controlled oscillator generating an oscillation signal according to a first control signal comprises a control signal adjuster and a plurality of ring-connected delay cells. The control signal adjuster receives the first control signal and generates a second control signal and a third control signal according to the first control signal. The second control signal is generated to be higher than a voltage level of the first control signal and the third control signal is generated to be higher than a voltage level of the second control signal. The plurality of ring-connected delay cells receive the first, the second and the third control signals to generate the oscillation signal at a first differential output terminal of one of the plurality of the ring-connected delay cells. For each ring-connected delay cell, the first differential output terminal and a second differential output terminal thereof are coupled to a first differential input terminal and a second differential input terminal of a next ring-connected delay cell. When the first control signal is lower than a first threshold voltage, the ring-connected delay cells are operated by the second control signal. When the second control signal is lower than a second threshold voltage, the ring-connected delay cells are operated by the third control signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 2:
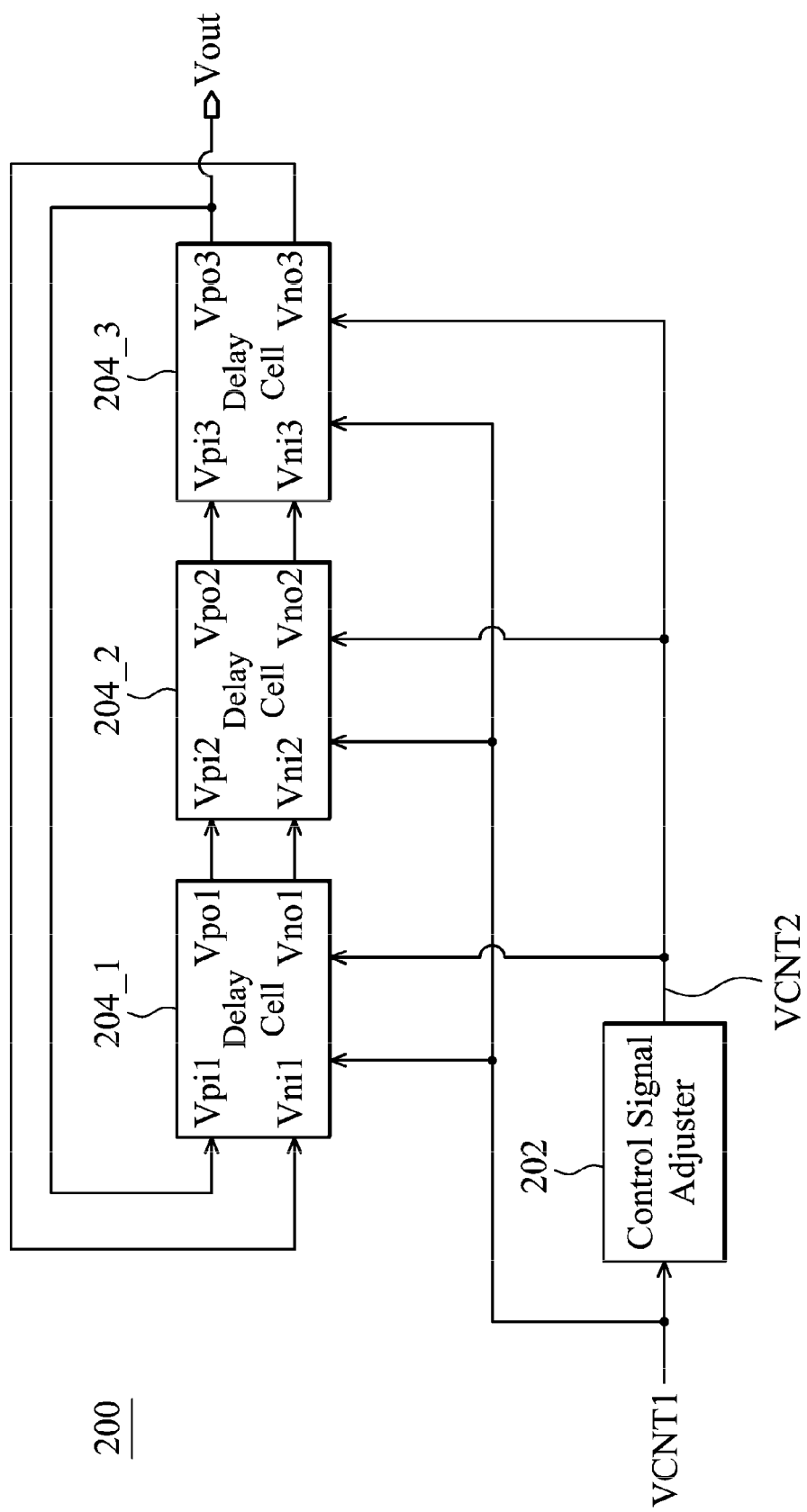
FIG. 2 shows a block diagram illustrating a voltage controlled oscillator 200 in accordance with an exemplary embodiment of the invention.

FIG. 2 shows a block diagram illustrating a voltage controlled oscillator 200 in accordance with an exemplary embodiment of the invention. The voltage controlled oscillator 200 comprises a control signal adjuster 202 and a plurality of delay cells 204_1-204_3. The delay cells 204_1-204_3 are ring-connected.

The control signal adjuster 202 receives a first control signal VCNT1 to generate a second control signal VCNT2. If the first control signal VCNT1 is lower than a transistor threshold voltage, the voltage level of the first control signal VCNT1 is boosted to a higher level to generate the second control signal VCNT2.

Under the control of both of the first and second control signals VCNT1 and VCNT2, an oscillation signal Vout is generated by the plurality of delay cells 204_1 to 204_3. The disclosed delay cells 204_1 to 204_3 are distinct from the conventional ones. Each of the disclosed delay cells 204_1 to 204_3 is controlled by the first control signal VCNT1 as well the second control signal VCNT2. For example, each delay cell contains two sets of current generation transistors. In the first set of current generation transistors, each transistor provides one control terminal to receive the first control signal VCNT1. In the second set of current generation transistors, each transistor provides one control terminal to receive the second control signal VCNT2. The first set and the second set of current generation transistors collectively contribute to an oscillation signal Vout.

Figure 3:
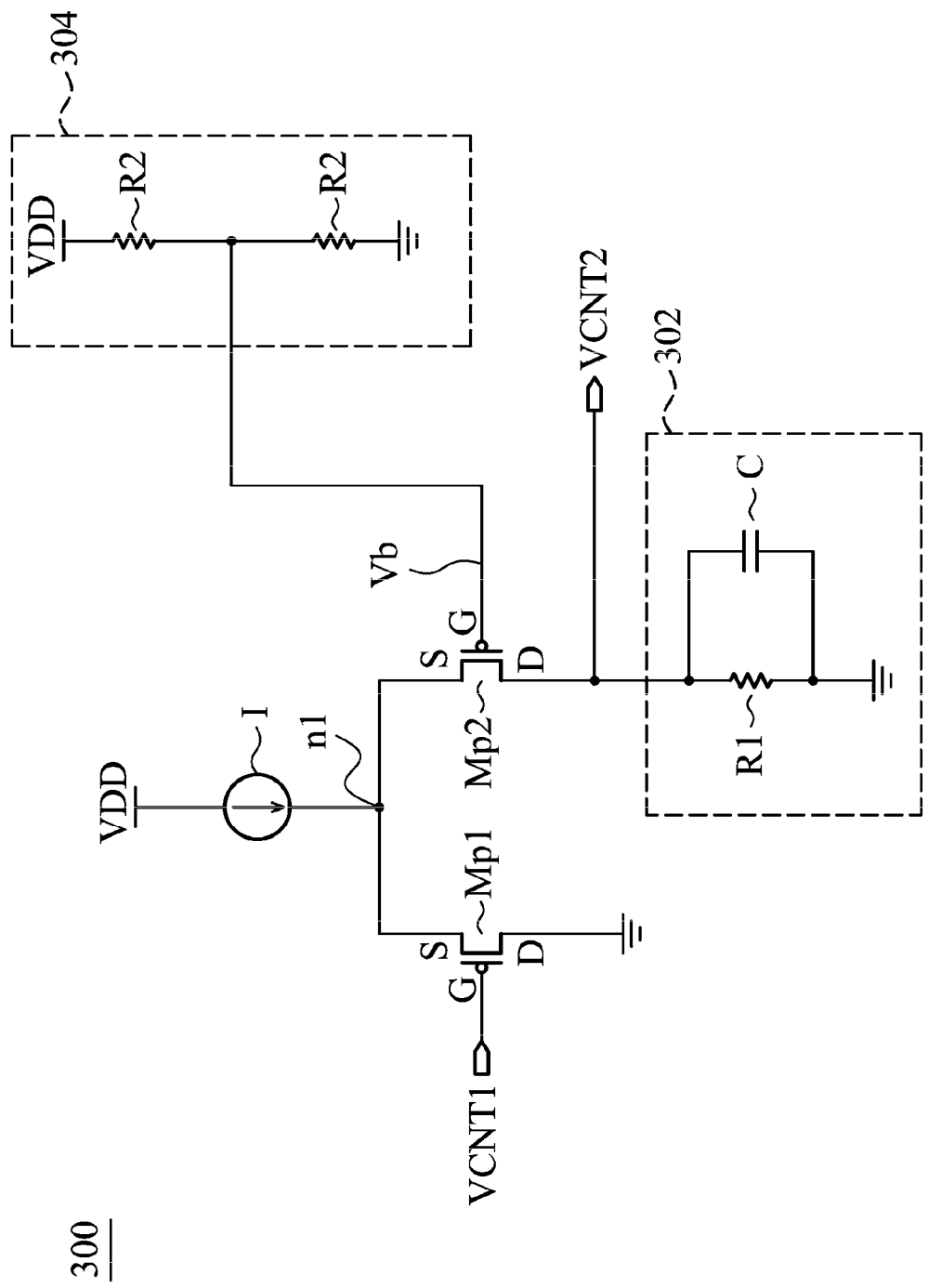
FIG. 3 illustrates an exemplary embodiment of the control signal adjuster 202 of FIG. 2.

FIG. 3 illustrates an exemplary embodiment of the control signal adjuster 202 of FIG. 2. As shown, the control signal adjuster 300 comprises a current source I, a first P-channel transistor Mp1, a second P-channel transistor Mp2 and a current-to-voltage conversion unit 302. The first P-channel transistor Mp1 has a source S coupled to an output terminal n1 of the current source I, a drain D grounded, and a gate G coupled to receive the first control signal VCNT1. The second P-channel transistor Mp2 has a source S coupled to the output terminal n1 of the current source I, a gate G controlled by a bias circuit 304, and a drain D. The current-to-voltage conversion unit 302 is operative to convert a current output from the drain D of the second P-channel transistor Mp2 to the second control signal VCNT2.

In the exemplary embodiment of FIG. 3, the current-to-voltage conversion unit 302 comprises a resistor R1 coupled at the drain D of the second P-channel transistor Mp2, wherein another terminal of the resistor R1 is grounded. The voltage difference across the resistor R1 is regarded as the second control signal VCNT2. In FIG. 3, the current-to-voltage conversion unit 302 further comprises an optional component, a capacitor C. As shown, one terminal of the capacitor C is coupled to the drain D of the second P-channel transistor Mp2 while another terminal of the capacitor C is coupled to the ground. The capacitor C is designed for voltage regulation.

The bias circuit 304 is operative to control the conduction of the second P-channel transistor Mp2. As shown, in the case wherein the current source I is powered by a voltage source VDD, the bias circuit 304 may be implemented by a voltage divider which uses two equivalent resistors (both labeled as R2) to halve the voltage source VDD to obtain a voltage level VDD/2 as the bias voltage Vb. The bias voltage Vb is applied at the gate G of the second P-channel transistor Mp2 to permanently turn on the second P-channel transistor Mp2.

In other embodiments, more than two resistors may be used in the bias circuit 304, and the current intensity of the current source I, the resistance of the resistor R1, the capacitance of the capacitor C and the value of the bias voltage Vb may be modified by a designer. The design concept of the control signal adjuster is: to ensure that the second control signal VCNT2 (converted from the current output from the drain D of the second P-channel transistor Mp2) is at a voltage level greater than that of the first control signal VCNT1 when the first control signal VCNT1 is lower than a transistor threshold voltage.

Note that the structure of the control signal adjuster 300 is not intended to limit the scope of the invention but just to provide an illustration. Any circuit or module capable of generating a second control signal VCNT2 having a voltage level greater than that of the first control signal VCNT1 when the voltage level of the first control signal VCNT1 is lower than the transistor threshold voltage is suitable for implementation of the disclosure.

Figure 4:
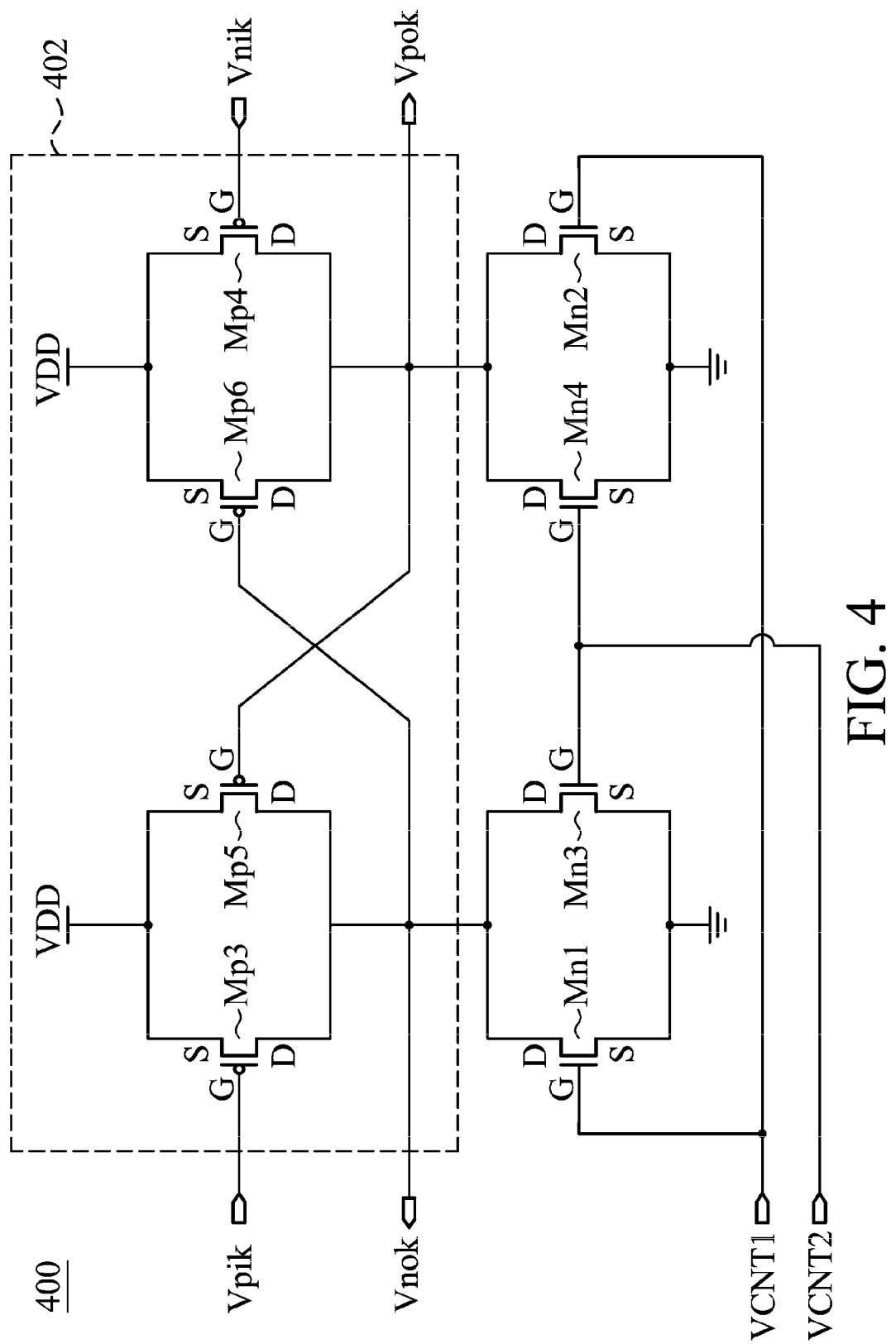
FIG. 4 depicts an exemplary embodiment of the delay cell (204_1, 204_2 or 204_3) of FIG. 2.

FIG. 4 depicts an exemplary embodiment of the delay cell (204_1, 204_2 or 204_3) of FIG. 2. One single delay cell is shown in FIG. 4. The delay cell 400, of a differential structure, may be named a differential delay cell. The circuit shown in FIG. 4 may be implemented at any stage of the ring-connected delay cells. In the following description, k, an integer, represents the stage number of the delay cell.

The delay cell 400 of FIG. 4 comprises a differential input/output circuit 402. The differential input/output circuit 402 comprises a third P-channel transistor Mp3, a fourth P-channel transistor Mp4, a fifth P-channel transistor Mp5 and a sixth P-channel transistor Mp6. The third P-channel transistor Mp3 has a gate G working as a first differential input terminal Vpik (where k represents the stage number of the delay cell), a source S coupled to the voltage source VDD, and a drain D. The fourth P-channel transistor Mp4 has a gate G working as a second differential input terminal Vnik (where k represents the stage number of the delay cell), a source S coupled to the voltage source VDD and a drain D. The fifth P-channel transistor Mp5 has a gate G coupled to the drain D of the fourth P-channel transistor Mp4 and working as a first differential output terminal Vpok (where k represents the stage number of the delay cell), a source S coupled to the voltage source VDD, and a drain D coupled to the drain D of the third P-channel transistor Mp3. The sixth P-channel transistor Mp6 has a gate G coupled to the drain D of the third P-channel transistor Mp3 and working as a second differential output terminal Vnok, a source S coupled to the voltage source VDD, and a drain D coupled to the drain D of the fourth P-channel transistor Mp4.

In a ring-connected structure, the first and second differential output terminals of each delay cell are coupled to the first and second differential input terminals of the delay cell in the next stage. For example, referring to FIG. 2, the first and second differential input terminals Vpi1 and Vni1 of the delay cell 204_1 receive the signals from the first and second differential output terminals Vpo3 and Vno3 of the delay cell 204_3, the first and second differential input terminals Vpi2 and Vni2 of the delay cell 204_2 receive the signals from the first and second differential output terminals Vpo1 and Vno1 of the delay cell 204_1, and the first and second differential input terminals Vpi3 and Vni3 of the delay cell 204_3 receive the signals from the first and second differential output terminals Vpo2 and Vno2 of the delay cell 2042. In the ring-connected structure of FIG. 2, the oscillation signal Vout is provided at the first differential output terminal Vpo3 of the delay cell 204_3. Note that the amount of the delay cells utilized in a ring-connected structure is not limited to 3. More delay cells may be utilized in forming the ring-connected structure.

Referring to the delay cell 400 of FIG. 4, the drains (D) of the third, fourth, fifth and sixth P-channel transistors Mp3, Mp4, Mp5 and Mp6 are further connected to the first set and second sets of the current generation transistors, as detailed in the following paragraphs.

In the delay cell 400, a first N-channel transistor Mn1 and a second N-channel transistor Mn2 form a first set of current generation transistors, while a third N-channel transistor Mn3 and a fourth N-channel transistor Mn4 form the second set of current generation transistors.

This paragraph describes one structure for the first set of current generation transistors. The first N-channel transistor Mn1 has a gate G receiving the first control signal VCNT1, a source S which is grounded, and a drain D coupled to the drains (D) of the third and fifth P-channel transistors Mp3 and Mp5. The second N-channel transistor Mn2 has a gate G receiving the first control signal VCNT1, a source S which is grounded, and a drain D coupled to the drains (D) of the fourth and sixth P-channel transistors Mp4 and Mp6. According to the first control signal VCNT1, the first and second N-channel transistors Mn1 and Mn2 contribute to the current charging/discharging of the parasitic capacitors of the delay cell 400, and thereby contribute to an oscillation signal (Vout of FIG. 2) generated by the ring-connected structure.

This paragraph describes one structure for the second set of current generation transistors. The third N-channel transistor Mn3 has a gate G receiving the second control signal VCNT2, a source S which is grounded, and a drain D coupled to the drains (D) of the third and fifth P-channel transistors Mp3 and Mp5. The fourth N-channel transistor Mn4 has a gate G receiving the second control signal VCNT2, a source S which is grounded, and a drain D coupled to the drains (D) of the fourth and sixth P-channel transistors Mp4 and Mp6. According to the second control signal VCNT2, the third and the fourth N-channel transistors Mn3 and Mn4 contribute to the current charging/discharging of the parasitic capacitors of the delay cell 400, and thereby contribute to the oscillation signal (Vout of FIG. 2) as well.

Figure 1:
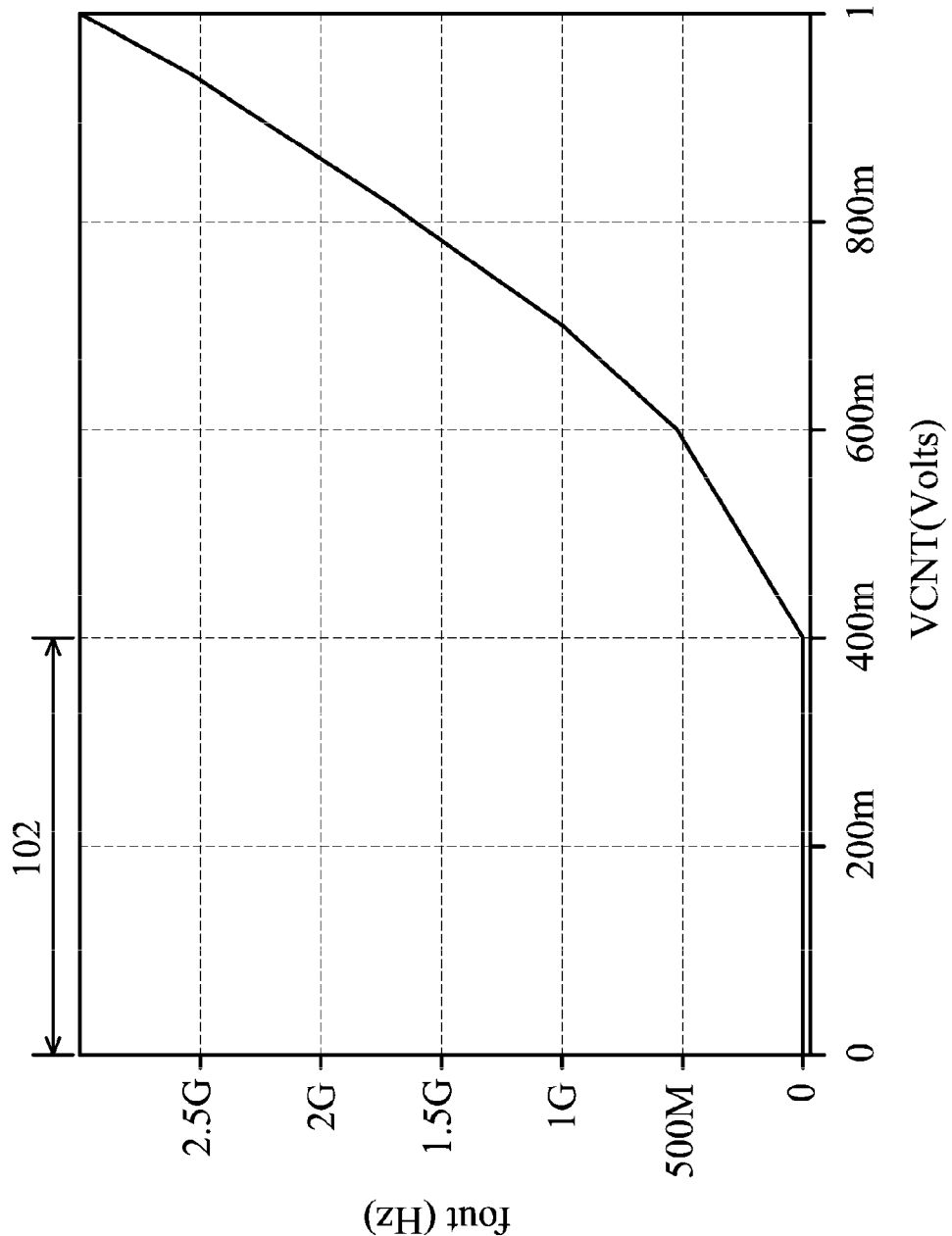
FIG. 1 shows a relationship between a voltage input VCNT and an oscillation frequency fout of a conventional VCO circuit.
Figure 5:
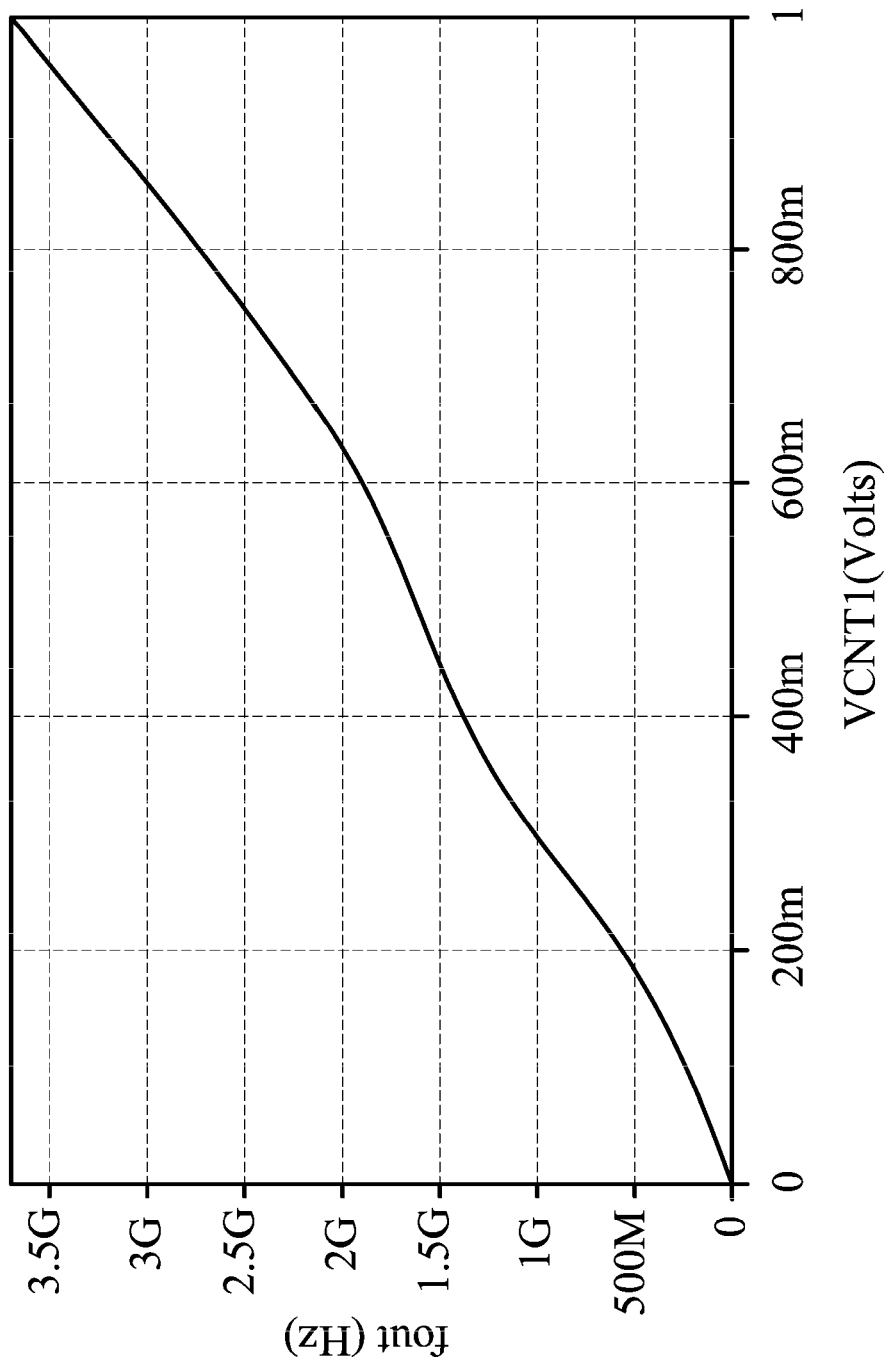
FIG. 5 relates to an exemplary embodiment of the VCOs of the invention, which illustrates a relationship between a first control signal VCNT1 and an oscillation frequency fout of an oscillation signal Vout generated by the disclosed VCO.

For the delay cell 400 of FIG. 4, when the first control signal VCNT1 is too weak to turn on the first set of current generation transistors (including the first and second N-channel transistors Mn1 and Mn2), the delay cell 400 is still functional since the second control signal VCNT2 boosted from the first control signal VCNT1 is high enough to turn on the second set of current generation transistors (including the third and the fourth N-channel transistors Mn3 and Mn4). The silent region 102 shown in FIG. 1 is eliminated in the disclosure of the invention. FIG. 5 relates to an exemplary embodiment of the VCOs of the invention, which illustrates a relationship between a first control signal VCNT1 and an oscillation frequency fout of an oscillation signal Vout generated by the disclosed VCO. In comparison with FIG. 1, the silent region 102 of FIG. 1 is eliminated in FIG. 5. The VCOs disclosed in the invention perform well in low operating voltage environments. Additionally, transistor threshold becomes a critical issue for those circuits made by advanced process technologies because they will work under low power supply operation with reduced supply voltage. Advantageously, the disclosed linearization VCO circuit is capable of providing output signal with unchanged frequency even if associated input voltage is below transistor threshold. Accordingly, the disclosed linearization VCO circuit is advantageously adaptive to all kinds of rail-to-rail input circuits receiving input signal with full range of power supply. Furthermore, the relationship between the first control signal VCNT1 and the oscillation frequency fout is almost linear. In comparison with conventional VCOs, the VCOs of the invention considerably suppress the jitter of the oscillation signal Vout.

Figure 6:
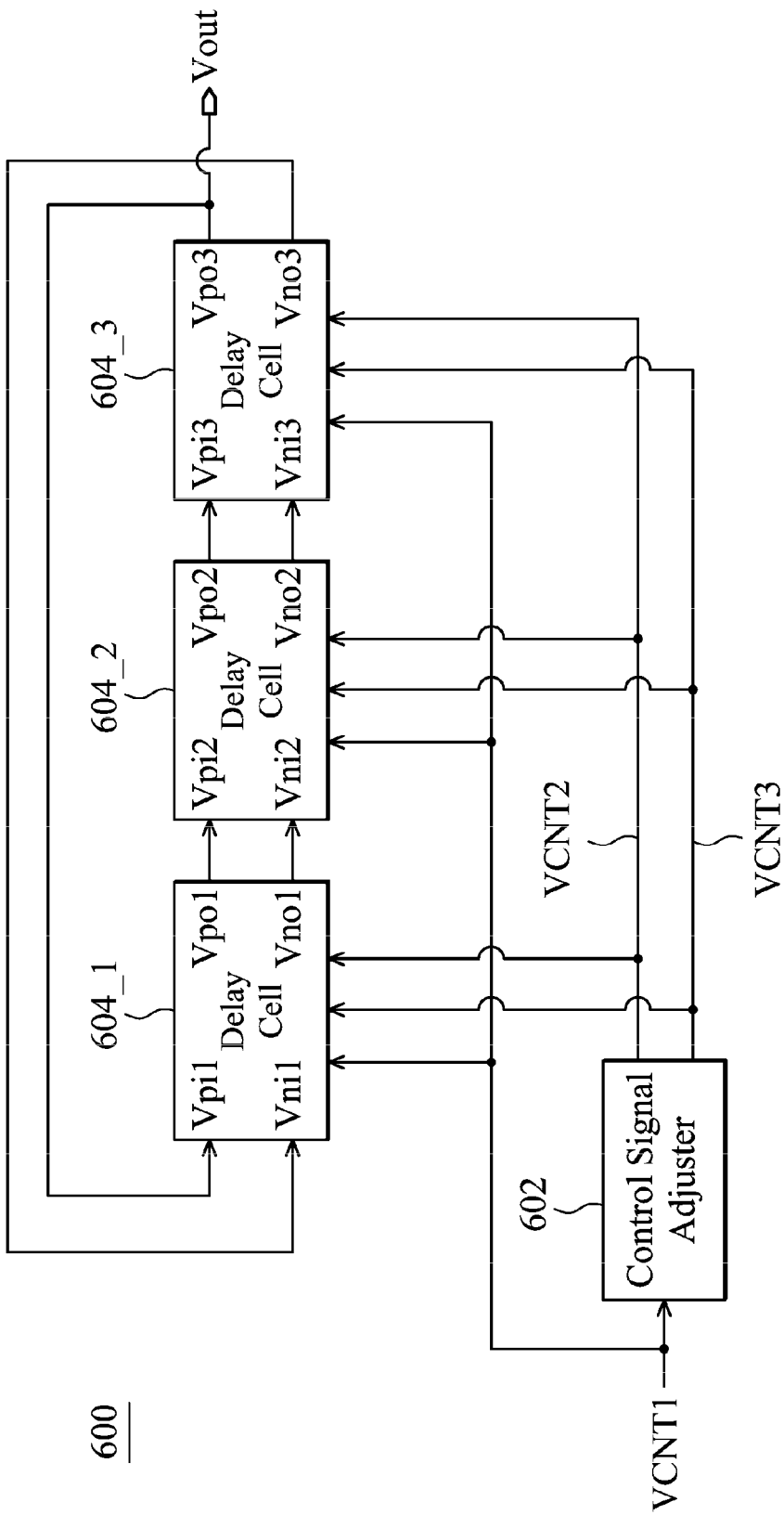
FIG. 6 shows a block diagram illustrating a voltage controlled oscillator 200 in accordance with another exemplary embodiment of the invention.

FIG. 6 shows a block diagram illustrating a voltage controlled oscillator 600 in accordance with another exemplary embodiment of the invention to compensate for the possible process variations during fabrication. Process variations may result in variations in the threshold voltages of the devices, which in turn may result in variations in the frequency of the oscillation signal Vout. For example, in the slow-slow (SS) process corner, the threshold voltages may be higher, and the frequency of the oscillation signal Vout may be lower. In the fast-fast (FF) process corner, the threshold voltages may be lower, and the frequency of the oscillation signal Vout may be higher. Voltage controlled oscillators are commonly used in phase-locked loops (PLL), and such frequency variations may cause instabilities of the PLL clock signal (i.e., jitter). The voltage controlled oscillator 600 is similar with the voltage controlled oscillator 200 in FIG. 2 except that the control signal adjuster 602 generates a third control signal VCNT3 in addition to the second control signal VCNT2. Each of the disclosed delay cells 604_1 to 604_3 is similarly controlled by the first control signal VCNT1, the second control signal VCNT2, and the third control signal VCNT3.

Figure 7:
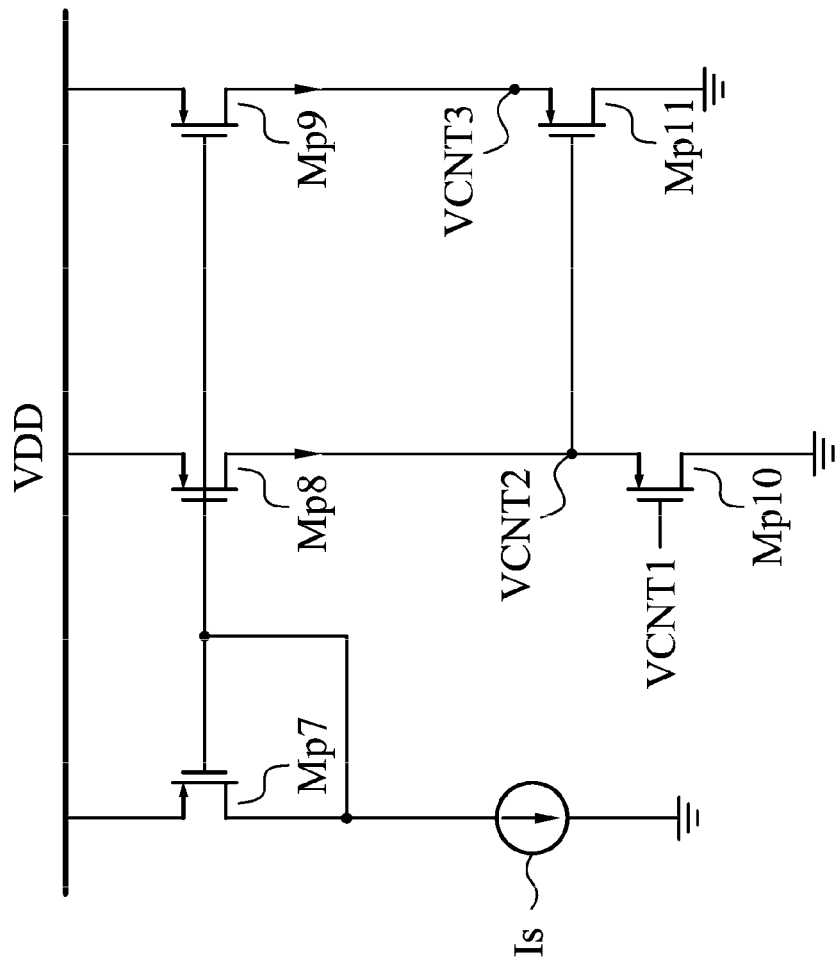
FIG. 7 illustrates an exemplary embodiment of the control signal adjuster 602 of FIG. 6.

FIG. 7 illustrates an exemplary embodiment of the control signal adjuster 602 of FIG. 6. As shown, the control signal adjuster 700 comprises a current source Is, a current mirror comprising a seventh P-channel transistor Mp7, an eighth P-channel transistor Mp8, and a ninth P-channel transistor Mp9, a tenth P-channel transistor Mp10, and an eleventh P-channel transistor Mp11. The gates of the seventh P-channel transistor Mp7, the eighth P-channel transistor Mp8, and the ninth P-channel transistor Mp9 are coupled to the drain of the seventh P-channel transistor Mp7, which is coupled to the current source Is. The sources of the seventh P-channel transistor Mp7, the eighth P-channel transistor Mp8, and the ninth P-channel transistor Mp9 are coupled to the voltage source VDD, and thus the current generated by the current source Is at the drain of the seventh P-channel transistor Mp7 is mirrored to the drains of the eighth P-channel transistor Mp8 and the ninth P-channel transistor Mp9. The tenth P-channel transistor Mp10 has a gate coupled to the first control signal VCNT1, a drain coupled to ground, and a source coupled to the drain of the eighth P-channel transistor Mp8. The eleventh P-channel transistor Mp11 has a gate coupled to the source of the tenth P-channel transistor Mp10, a drain coupled to ground, and a source coupled to the drain of the ninth P-channel transistor Mp9. The second control signal VCNT2 and the third control signal VCNT3 are generated at the sources of the tenth P-channel transistor Mp10 and the eleventh P-channel transistor Mp11, respectively. Therefore, the second control signal VCNT2 may be generated to be higher than the first control signal VCNT1 by approximately a threshold voltage, and the third control signal VCNT3 may be generated to be higher than the second control signal VCNT2 by approximately another threshold voltage. Thusly, the second control signal VCNT2 and the third control signal VCNT3 may be higher in the SS process corner and lower in the FF process corner.

Figure 8:
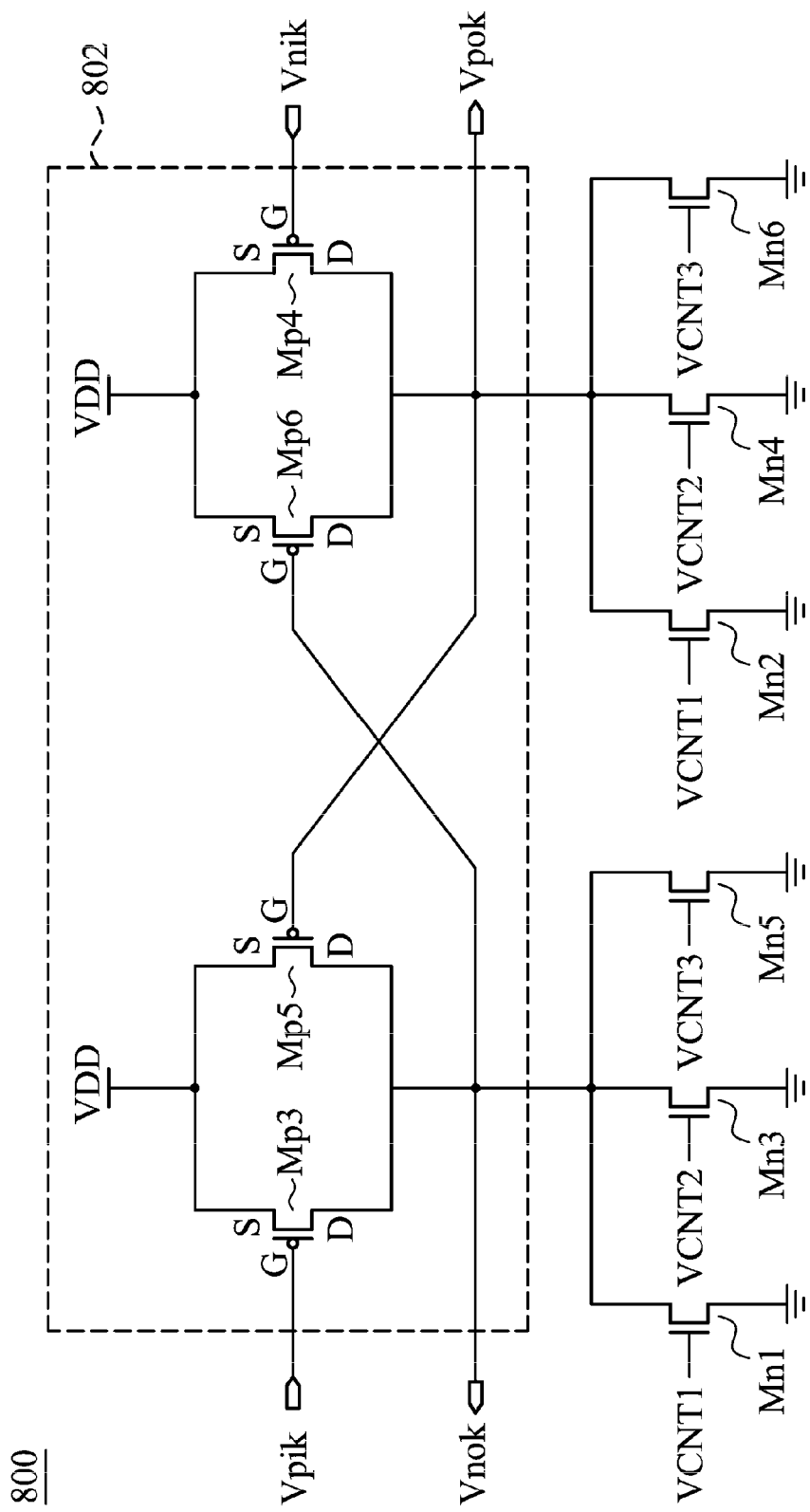
FIG. 8 depicts an exemplary embodiment of the delay cell (604_1, 604_2 or 604_3) of FIG. 6.

FIG. 8 depicts an exemplary embodiment of the delay cell (604_1, 604_2 or 604_3) of FIG. 6. One single delay cell is shown in FIG. 8, which comprises a differential input/output circuit 802 similar with the differential input/output circuit 402 in FIG. 4 and the details will not be repeated here. The drains of the third, fourth, fifth and sixth P-channel transistors Mp3, Mp4, Mp5 and Mp6 are coupled to a first set, a second set, and a third set of the current generation transistors. In the delay cell 800, a first N-channel transistor Mn1 and a second N-channel transistor Mn2 form a first set of current generation transistors with their gates coupled to the first control signal VCNT1, a third N-channel transistor Mn3 and a fourth N-channel transistor Mn4 form the second set of current generation transistors with their gates coupled to the second control signal VCNT2, and a fifth N-channel transistor Mn5 and a sixth N-channel transistor Mn6 form the third set of current generation transistors with their gates coupled to the third control signal VCNT3. The structures of the three sets of current generation transistors are similar to those described above and will not be repeated here.

For the delay cell 800 of FIG. 8, when the first control signal VCNT1 is too weak to turn on the first set of current generation transistors, the delay cell 800 is still functional since the second control signal VCNT2 and the third control signal VCNT3 boosted from the first control signal VCNT1 are high enough to turn on the second set and third set of current generation transistors, respectively. In addition, in the SS process corner, the second control signal VCNT2 and the third control signal VCNT3 may be generated higher, compensating for the increased threshold voltages; in the FF process corner, the second control signal VCNT2 and the third control signal VCNT3 may be generated lower, compensating for the lowered threshold voltages. Qualitatively, the current provided to the differential input/output circuit 802 by, for example, the current generation transistors Mn1, Mn3, and Mn5 may be approximated by $k_1(VCNT1-Vth)^2 + k_3((VCNT1+Vth)-Vth)^2 + k_5((VCNT1+2Vth)-Vth)^2 = k_1(VCNT1-Vth)^2 + k_3(VCNT1)^2 + k_5(VCNT1+Vth)^2$, where Vth is the threshold voltage and $k_1$, $k_3$, and $k_5$ are the transconductance parameters of the current generation transistors Mn1, Mn3, and Mn5, respectively. Since the first term is negatively correlated with Vth and the third term is positively correlated with Vth, the driving current variation resulting from process variations may be minimized by using the three control signals VCNT1, VCNT2, and VCNT3, keeping the frequency of the oscillation signal Vout constant in addition to eliminating the silent region 102.

Note that the differential design of the delay cells is not intended to limit the scope of the invention. Modifications may be made on any delay cell without departing from the spirit of the disclosed embodiments to achieve the same purpose.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage controlled oscillator generating an oscillation signal according to a first control signal, comprising:
    a control signal adjuster, receiving the first control signal and generating a second control signal and a third control signal according to the first control signal, wherein the second control signal is generated to be higher than a voltage level of the first control signal and the third control signal is generated to be higher than a voltage level of the second control signal; and
    a plurality of delay cells, ring-connected and controlled by the first, the second, and the third control signals to generate the oscillation signal, wherein each delay cell comprises:
        a first set of current generation transistors, wherein each transistor provides a control terminal to receive the first control signal;
        a second set of current generation transistors, wherein each transistor provides a control terminal to receive the second control signal; and
        a third set of current generation transistors, wherein each transistor provides a control terminal to receive the third control signal.

2. The voltage controlled oscillator as claimed in claim 1, wherein the second control signal is generated to be higher than the voltage level of the first control signal by approximately a first threshold voltage and the third control signal is generated to be higher than the voltage level of the second control signal by approximately a second threshold voltage.

3. The voltage controlled oscillator as claimed in claim 1, wherein the control signal adjuster comprises:
    a current mirror, generating a first mirror current and a second mirror current according to a current source;
    a tenth P-channel transistor, having a source coupled to the first mirror current, a gate coupled to the first control signal, and a drain coupled to ground; and
    an eleventh P-channel transistor, having a source coupled to the second mirror current, a gate coupled to the source of the tenth P-channel transistor, and a drain coupled to ground,
    wherein the second control signal is generated at the source of the tenth P-channel transistor and the third control signal is generated at the source of the eleventh P-channel transistor.

4. The voltage controlled oscillator as claimed in claim 3, wherein the current mirror comprises:
    a seventh P-channel transistor, having a source coupled to a voltage source, a gate and a drain both coupled to the current source;
    an eighth P-channel transistor, having a source coupled to the voltage source, a gate coupled to the gate of the seventh P-channel transistor, and a drain generating the first mirror current; and
    a ninth P-channel transistor, having a source coupled to the voltage source, a gate coupled to the gate of the seventh P-channel transistor, and a drain generating the second mirror current.

5. The voltage controlled oscillator as claimed in claim 1, wherein each of the delay cells further comprises a differential input/output circuit coupled to the first, the second and the third sets of current generation transistors, wherein the differential input/output circuit comprises:
    a third P-channel transistor, having a gate working as a first differential input terminal, a source coupled to a voltage source, and a drain;
    a fourth P-channel transistor, having a gate working as a second differential input terminal, a source coupled to the voltage source, and a drain;
    a fifth P-channel transistor, having a gate coupled to the drain of the fourth P-channel transistor to work as a first differential output terminal, a source coupled to the voltage source, and a drain coupled to the drain of the third P-channel transistor; and
    a sixth P-channel transistor, having a gate coupled to the drain of the third P-channel transistor to work as a second differential output terminal, a source coupled to the voltage source, and a drain coupled to the drain of the fourth P-channel transistor.

6. The voltage controlled oscillator as claimed in claim 5, wherein:
    the first set of current generation transistors of each delay cell comprises:
        a first N-channel transistor, having a gate receiving the first control signal, a source coupled to ground, and a drain coupled to the drains of the third and the fifth P-channel transistors; and
        a second N-channel transistor, having a gate receiving the first control signal, a source coupled to the ground, and a drain coupled to the drains of the fourth and the sixth P-channel transistors;
    the second set of current generation transistors of each delay cell comprises:
        a third N-channel transistor, having a gate receiving the second control signal, a source coupled to the ground, and a drain coupled to the drains of the third and the fifth P-channel transistors; and
        a fourth N-channel transistor, having a gate receiving the second control signal, a source coupled to the ground, and a drain coupled to the drains of the fourth and the sixth P-channel transistors; and
    the third set of current generation transistors of each delay cell comprises:

a fifth N-channel transistor, having a gate receiving the third control signal, a source coupled to ground, and a drain coupled to the drains of the third and the fifth P-channel transistors; and a sixth N-channel transistor, having a gate receiving the third control signal, a source coupled to the ground, and a drain coupled to the drains of the fourth and the sixth P-channel transistors.

7. The voltage controlled oscillator as claimed in claim 5, wherein, for each delay cell, the first and the second differential output terminals thereof are coupled to the first and the second differential input terminals of a next delay cell.

8. A voltage controlled oscillator generating an oscillation signal according to a first control signal, comprising:

a control signal adjuster, receiving the first control signal and generating a second control signal and a third control signal according to the first control signal, wherein the second control signal is generated to be higher than a voltage level of the first control signal and the third control signal is generated to be higher than a voltage level of the second control signal; and a plurality of ring-connected delay cells, receiving the first, the second and the third control signals to generate the oscillation signal at a first differential output terminal of one of the plurality of the ring-connected delay cells, wherein, for each ring-connected delay cell, the first differential output terminal and a second differential output terminal thereof are coupled to a first differential input terminal and a second differential input terminal of a next ring-connected delay cell.

9. The voltage controlled oscillator as claimed in claim 8, wherein the second control signal is generated to be higher than the voltage level of the first control signal by approximately a first threshold voltage and the third control signal is generated to be higher than the voltage level of the second control signal by approximately a second threshold voltage.

10. The voltage controlled oscillator as claimed in claim 8, wherein the control signal adjuster comprises:

a current mirror, generating a first mirror current and a second mirror current a tenth P-channel transistor, having a source coupled to the first mirror current, a gate coupled to the first control signal, and a drain coupled to ground; and an eleventh P-channel transistor, having a source coupled to the second mirror current, a gate coupled to the source of the tenth P-channel transistor, and a drain coupled to ground, wherein the second control signal is generated at the source of the tenth P-channel transistor and the third control signal is generated at the source of the eleventh P-channel transistor.

11. The voltage controlled oscillator as claimed in claim 10, wherein the current mirror comprises:

a seventh P-channel transistor, having a source coupled to a voltage source, a gate and a drain both coupled to the current source;

an eighth P-channel transistor, having a source coupled to the voltage source, a gate coupled to the gate of the seventh P-channel transistor, and a drain generating the first mirror current; and a ninth P-channel transistor, having a source coupled to the voltage source, a gate coupled to the gate of the seventh P-channel transistor, and a drain generating the second mirror current.

12. The voltage controlled oscillator as claimed in claim 8, wherein each of the delay cells further comprises a differential input/output circuit coupled to the first, the second and the third sets of current generation transistors, wherein the differential input/output circuit comprises:

a third P-channel transistor, having a gate working as the first differential input terminal, a source coupled to a voltage source, and a drain;

a fourth P-channel transistor, having a gate working as the second differential input terminal, a source coupled to the voltage source, and a drain;

a fifth P-channel transistor, having a gate coupled to the drain of the fourth P-channel transistor to work as the first differential output terminal, a source coupled to the voltage source, and a drain coupled to the drain of the third P-channel transistor; and a sixth P-channel transistor, having a gate coupled to the drain of the third P-channel transistor to work as the second differential output terminal, a source coupled to the voltage source, and a drain coupled to the drain of the fourth P-channel transistor.

13. The voltage controlled oscillator as claimed in claim 12, wherein:

the first set of current generation transistors of each delay cell comprises:

a first N-channel transistor, having a gate receiving the first control signal, a source coupled to ground, and a drain coupled to the drains of the third and the fifth P-channel transistors; and a second N-channel transistor, having a gate receiving the first control signal, a source coupled to the ground, and a drain coupled to the drains of the fourth and the sixth P-channel transistors;

the second set of current generation transistors of each delay cell comprises:

a third N-channel transistor, having a gate receiving the second control signal, a source coupled to the ground, and a drain coupled to the drains of the third and the fifth P-channel transistors; and a fourth N-channel transistor, having a gate receiving the second control signal, a source coupled to the ground, and a drain coupled to the drains of the fourth and the sixth P-channel transistors; and the third set of current generation transistors of each delay cell comprises:

a fifth N-channel transistor, having a gate receiving the third control signal, a source coupled to ground, and a drain coupled to the drains of the third and the fifth P-channel transistors; and a sixth N-channel transistor, having a gate receiving the third control signal, a source coupled to the ground, and a drain coupled to the drains of the fourth an d the sixth P-channel transistors.

* * * * *